United States Patent
Liao

(10) Patent No.: US 7,112,930 B2
(45) Date of Patent: Sep. 26, 2006

(54) DEVICE AND METHOD FOR DETECTING HIGH VOLTAGE

(75) Inventor: Tai-Shan Liao, Hsin-Chu (TW)

(73) Assignee: Precision Instrument Development Center, Hsin-chu (TW)

( * ) Notice: Subject to any disclaimer, the term of this patent is extended or adjusted under 35 U.S.C. 154(b) by 21 days.

(21) Appl. No.: 10/979,141

(22) Filed: Nov. 3, 2004

(65) Prior Publication Data

US 2006/0043905 A1    Mar. 2, 2006

(30) Foreign Application Priority Data

Aug. 30, 2004  (TW) .............................. 93126094 A

(51) Int. Cl.
*H05B 37/00* (2006.01)
*H05B 37/02* (2006.01)

(52) U.S. Cl. ..................................... 315/226; 315/291

(58) Field of Classification Search ................ 315/291, 315/307, DIG. 5, 224, 226, DIG. 7
See application file for complete search history.

(56) References Cited

U.S. PATENT DOCUMENTS 5,083,065 A * 1/1992 Sakata et al. ............... 315/307
5,751,120 A * 5/1998 Zeitler et al. ............... 315/307
6,160,362 A * 12/2000 Shone et al. ................ 315/308

* cited by examiner

*Primary Examiner*—Tuyet Vo
*Assistant Examiner*—Minh Dieu A
(74) *Attorney, Agent, or Firm*—Harness, Dickey & Pierce, PLC

(57) ABSTRACT

A non-contact voltage detecting method and device are provided. The non-contact voltage detecting device includes a discharge lamp having an excitation voltage and a lighting voltage applied thereon, a boost circuit coupled to the discharge lamp for providing an operation voltage to the discharge lamp and a switch circuit coupled to the boost circuit for providing a periodical high-low signal level to control the boost circuit wherein the discharge lamp flickers if there is a relatively high voltage power nearby, while the discharge lamp is extinguished without the relatively high voltage power nearby. In addition, the device is capable of being an illumination source by increasing an input voltage of the boost circuit when it is not used for detecting the high voltage power.

12 Claims, 1 Drawing Sheet

DEVICE AND METHOD FOR DETECTING HIGH VOLTAGE

FIELD OF THE INVENTION

The present invention is related to a high voltage detecting device and, in particular, to a non-contact voltage detecting device using a gas discharge lamp for detecting the high voltage nearby.

BACKGROUND OF THE INVENTION

The high voltage power is a kind of invisible energy. It is popularized and useful in various applications, such as physics, chemistry, biochemistry, material science and Micro-Electro Mechanical System (MEMS). However, it would be harmful and dangerous if the high voltage power is not properly applied. It is necessary to develop a device for detecting the high voltage power.

A conventional method for detecting the high voltage power relates to utilizing a high impedance resistor connected to an electrode of the high voltage power for detecting a lower voltage power relative thereto. Such a low voltage is resulted from the decline of the original high voltage. By reading out the low voltage through a general detecting instrument, one can judge weather the high voltage power exists or not.

However, if the high impedance resistor is failed or the insulation property of the detecting instrument is bad, the high voltage power may damage the detecting instrument and hurt the person who operates it. Therefore, in order to overcome the disadvantages of the conventional method, the present invention provides a novel detecting method and device for safely detecting the high voltage power.

SUMMARY OF THE INVENTION

In accordance with a first aspect of the invention, a non-contact voltage detecting device is provided. The non-contact voltage detecting device includes a discharge lamp having an excitation voltage and a lighting voltage applied thereon, a boost circuit coupled to the discharge lamp for providing an operation voltage to the discharge lamp and a switch circuit coupled to the boost circuit for providing a periodical high-low signal level to control the boost circuit.

Preferably, the discharge lamp is further electrically connected to a first capacitor, and both the discharge lamp and the first capacitor are coupled to the boost circuit.

Preferably, the discharge lamp is lighted when the operation voltage reaches the excitation voltage, until the operation voltage declines to lower than the lighting voltage.

Preferably, the boost circuit further includes a transformer, a second capacitor, a first and a second resistors, and a first and a second transistors.

Preferably, the operation voltage originally provided by the boost circuit is lower than the excitation voltage but higher than the lighting voltage.

Preferably, the switch circuit further includes a third and a fourth capacitors, a third resistor, a fourth resistor, a fifth resistor, a sixth resistor, a seventh resistor, and a third and a fourth transistors.

Preferably, the switch circuit is further coupled to the boost circuit via a fifth transistor and a relay.

Preferably, when the boost circuit is turned off via the relatively high periodical high-low signal level, the operation voltage is lower than the lighting voltage, when the boost circuit is turned on via the control of the relatively low periodical high-low signal level, the operation voltage is higher than the excitation voltage, and thereby the discharge lamp flickers.

Preferably, the discharge lamp is extinguished without the relatively high voltage power being detected.

Preferably, the discharge lamp is extinguished due to the operation voltage in a voltage range lower than the excitation voltage but higher than said lighting voltage.

Preferably, the discharge lamp is used as an illumination source by increasing an input voltage of the boost circuit.

In accordance with a second aspect of the present invention, a voltage detecting device is provided. The voltage detecting device includes a discharge lamp having an excitation voltage and a lighting voltage applied thereon, and a boost circuit coupled to the discharge lamp for providing an operation voltage to the discharge lamp.

Preferably, the operation voltage originally provided by the boost circuit is lower than the excitation voltage but higher than the lighting voltage.

Preferably, the discharge lamp is lighted when there is a relatively high voltage nearby, while the discharge lamp is extinguished without said relatively high voltage nearby.

In accordance with a third aspect of the present invention, a non-contact voltage detecting method is provided. The non-contact voltage detecting method includes the steps of providing a discharge lamp having an excitation voltage and a lighting voltage provided thereon, and controlling an operation voltage applied on the discharge lamp in one of a first condition and a second condition.

Preferably, the first condition represents the operation voltage lower than the excitation voltage but higher than the lighting voltage, and the second condition represents the operation voltage lower than the lighting voltage.

Preferably, the method further includes a step of providing a boost circuit and a switch circuit, wherein the boost circuit is alternately activated and deactivated by the switch circuit so that the operation voltage is switched between the first and the second conditions.

Preferably, when a relatively high voltage is detected nearby, the discharge lamp flickers since the operation voltage applied on the discharge lamp is alternately shifted between higher than the excitation voltage and lower than the lighting voltage, and when no high voltage is detected, the discharge lamp is extinguished since the operation voltage applied on the discharge lamp is failed to reach the excitation voltage.

The foregoing and other features and advantages of the present invention will be more clearly understood through the following descriptions with reference to the drawings, wherein:

DETAILED DESCRIPTION OF THE PREFERRED EMBODIMENT

Figure 1:
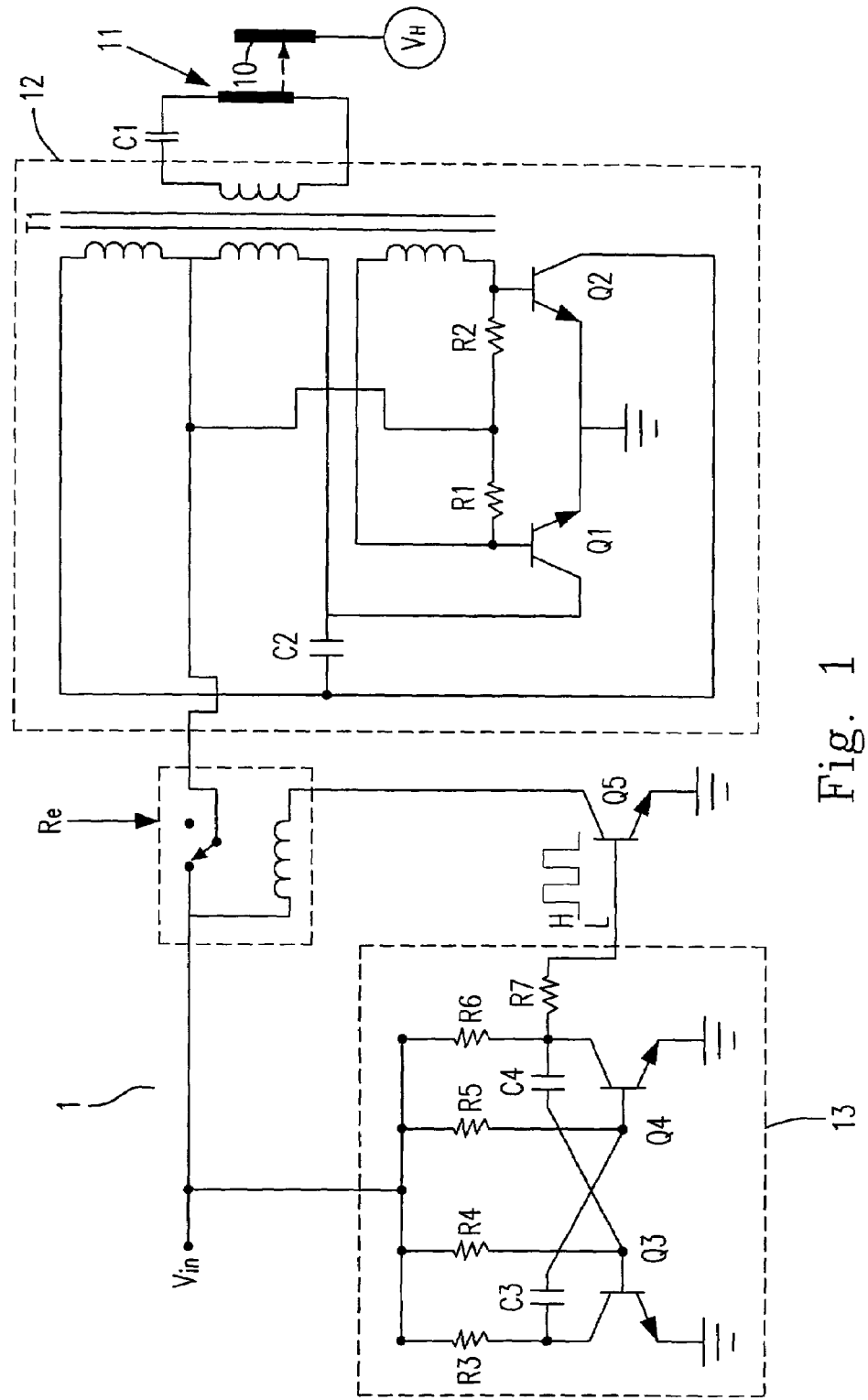
FIG. 1 is a diagram showing the configuration of a non-contact voltage detecting device according to a preferred embodiment of the present invention.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Please refer to FIG. 1, which illustrates the configuration of a non-contact voltage detecting device 1 according to a preferred embodiment of the present invention. The non-contact voltage detecting device 1 of the present invention is composed of a discharge lamp 11, a boost circuit 12 and a switch circuit 13, wherein the discharge lamp 11 is further electrically connected to a first capacitor C1. The discharge lamp 11 and the capacitor C1 are coupled to the boost circuit 12.

The boost circuit 12 includes a transformer T1, a second capacitor C2, a first and a second resistors R1 and R2, and a first and a second transistors Q1 and Q2.

The switch circuit 13 includes plural resistors R3–R7, a third and a fourth capacitors C3 and C4, and a third and a fourth transistor Q3 and Q4, and the switch circuit 13 is further coupled to the boost circuit 12 through a fifth transistor Q5 and a relay Re.

In this embodiment of the present invention, the discharge lamp 11 is a general gas discharge lamp which needs a high excitation voltage to ionize the gas therein for being started. The operation voltage of the discharge lamp 11 would decline to a lighting voltage thereof as soon as the discharge lamp is lighted.

In this case, an operation voltage provided by the boost circuit 12 for the discharge lamp 11 is set in a range between the excitation voltage and the lighting voltage of the discharge lamp 11, so that the discharge lamp 11 is not lighted when the operation voltage is lower than the excitation voltage.

When a high voltage power source 10 approaches to the discharge lamp 11, the operation voltage of the discharge lamp 11 would be increased to a voltage higher than the excitation voltage of the discharge lamp 11 so that the discharge lamp 11 is lighted. Therefore it can be used as an indicative signal for indicating if the high voltage power exists nearby.

Furthermore, the detectable distance at which the operation voltage provided by the boost circuit 12 could be enhanced depends on the voltage level of the high voltage power source 10. Hence, if the high voltage power source 10 has a higher voltage, the discharge lamp 11 is capable of detecting the high voltage power source 10 at a further distance.

Although the discharge lamp 11 is lighted with the induced voltage enhanced by the high voltage power source 10, it is still lighted when the high voltage power source 10 disappears. This is because the operation voltage provided by the boost circuit 12 is maintained between excitation voltage and the lighting voltage. Therefore, a switch circuit 13 for controlling the operation voltage provided by the boost circuit 12 is provided as follows.

The switch circuit 13 as shown in FIG. 1 provides a periodical high-low signal level to control the operation of the boost circuit 12. The boost circuit 12 is deactivated when the periodical high-low signal level provided by the switch circuit 13 is relatively high. On the other hand, the boost circuit 12 is activated when the periodical high-low signal level provided by the switch circuit 13 is relatively low. Therefore, the operation voltage provided by the boost circuit 12 is alternately switched between the conditions of 1) lower than the excitation voltage but higher than said lighting voltage, and 2) lower than the lighting voltage.

In specifics, when the high voltage power source 10 is nearby the discharge lamp 11, the operation voltage provided by the boost circuit 12 is shifted to a voltage higher than excitation voltage. However, when the boost circuit 12 is coupled to the switch circuit 13, the boost circuit 12 is alternately turned off and turned on via the control of the periodical high-low signal level, so that the operation voltage applied to the discharge lamp 11 is alternately switched to a voltage lower than the lighting voltage or to a voltage higher than excitation voltage, and thereby the discharge lamp 11 flickers to indicate if a high voltage power exists nearby.

On the other hand, if there is no voltage being detected, the operation voltage provided by the boost circuit 12 is controlled at a voltage in a range between the excitation voltage and the lighting voltage. However, when the boost circuit 12 is coupled to the switch circuit 13, the boost circuit 12 is alternately turned off and turned on via the periodical high-low signal level control, so that the operation voltage applied to the discharge lamp 11 is alternately switched to a voltage lower than the lighting voltage or to a voltage, which is higher than the lighting voltage but lower than excitation voltage. The discharge lamp 11 is hence extinguished as an indication indicating that no high voltage power exists nearby.

It is worthy to note that when it is not used for detecting the high voltage power, the discharge lamp 11 of the present invention is capable of being an illumination source since the discharge lamp 11 is lighted for an input voltage of the boost circuit 12 being increased.

Based on the above, the present invention provides a novel method and a novel device for detecting the high voltage power. With the design of the discharge lamp cooperated with a control circuit and a switch circuit which provides and controls the operation voltage applied thereon, the high voltage power nearby can be detected with a non-contact method and a warning signal emitted form the discharge lamp to indicate the high voltage exist nearby. Hence, the present invention not only has novelty and progressiveness, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar arrangements.

What is claimed is:

1. A high voltage detecting device, comprising:
   a discharge lamp having an excitation voltage and a lighting voltage applied thereon;
   a boost circuit coupled to said discharge lamp for providing an operation voltage to said discharge lamp wherein said operation is voltage is lower than said excitation voltage but higher than said lighting voltage; and
   a switch circuit coupled to said boost circuit for providing a periodical high-low signal level to control said boost circuit, wherein said boost circuit is turned off when said periodical high-low signal level is relatively high, while said boost circuit is turned on when said periodical high-low signal level is relatively low, and
   wherein when said booster circuit is turned off via said relatively high periodical high-low signal level, said operation voltage is lower than said lighting voltage, and when said boost circuit is turned on via said relatively low periodical high-low signal level, said operation voltage is higher than said excitation voltage, and thereby said discharge lamp flickers.

2. The voltage detecting device according to claim 1, wherein said discharge lamp is lighted, when said operation voltage reaches said excitation voltage, until said operation voltage declines to lower than said lighting voltage.

3. The voltage detecting device according to claim 1, wherein said discharge lamp is further electrically connected to a first capacitor, and both said discharge lamp and said first capacitor are coupled to said boost circuit.

4. The voltage detecting device according to claim 1, wherein said boost circuit further comprises a transformer, a second capacitor, first and second resistors, and first and second transistors.

5. The voltage detecting device according to claim 1, wherein said switch circuit further comprises third and fourth capacitors, a third resistor, a fourth resistor, a fifth resistor, a sixth resistor, a seventh resistor, and third and fourth transistors.

6. The voltage detecting device according to claim 1, wherein said switch circuit is further coupled to said boost circuit via a fifth transistor and a relay.

7. The voltage detecting device according to claim 1, wherein said discharge lamp is extinguished without said relatively high voltage power being detected.

8. The voltage detecting device according to claim 1, wherein said discharge lamp is extinguished due to said operation voltage in a voltage range lower than said excitation voltage but higher than said lighting voltage.

9. The voltage detecting device according to claim 1, wherein the discharge lamp is used as am illumination source by increasing an input voltage of said boost circuit.

10. A voltage detecting device, comprising:
a discharge lamp having an excitation voltage and a lighting voltage applied thereon; and
a boost circuit coupled to said discharge lamp for providing an operation voltage to said discharge lamp wherein said operation is voltage is lower than said excitation voltage but higher than said lighting voltage,
wherein when a relatively high voltage power is detected nearby, said discharge lamp flickers since operation voltage applied on said discharge lamp is alternately shifted between higher than said excitation voltage and lower than said lighting voltage, and
when no relatively high voltage power is detected, said discharge lamp is extinguished since said operation voltage applied on said discharge lamp has failed to reach said excitation voltage.

11. The method according to claim 10, further comprises a step of providing a boost circuit and a switch circuit, wherein said boost circuit is alternately turned on and turned off by said switch circuit so that said operation voltage is switched between said first and second conditions.

12. A voltage detecting method, comprising the steps of:
providing a discharge lamp having an excitation voltage and a lighting voltage provided thereon;
controlling an operation voltage applied on said discharge lamp in one of a first condition and a second condition,
wherein said first condition represents said operation voltage lower than said excitation voltage but higher than said lighting voltage, and said second condition represents said operation voltage lower than said lighting voltage, and
wherein when a relatively high voltage power is detected nearby, said discharge lamp flickers since operation voltage applied on said discharge lamp is alternately shifted between higher than said excitation voltage and lower than said lighting voltage, and when no relatively high voltage power is detected, said discharge lamp is extinguished since said operation voltage applied on said discharge lamp has failed to reach said excitation voltage.

* * * * *